United States Patent [19]

Wu

[11] Patent Number: 5,603,374
[45] Date of Patent: Feb. 18, 1997

[54] HEAT SINK ASSEMBLY FOR AN INTEGRATED CIRCUIT

[75] Inventor: Chia-fu Wu, Chungli City, Taiwan

[73] Assignee: Malico Inc., Taiwan

[21] Appl. No.: 628,883

[22] Filed: Apr. 5, 1996

[51] Int. Cl.⁶ .............................. F28F 7/00; H01L 23/02
[52] U.S. Cl. .................. 165/80.3; 165/121; 165/185; 174/16.3; 257/718; 257/719; 361/657; 361/704
[58] Field of Search .................... 165/80.3, 121, 165/185; 174/16.3; 257/718, 719, 722; 361/697, 702–704, 707

[56] References Cited

U.S. PATENT DOCUMENTS

| | | | |
|---|---|---|---|
| 4,607,685 | 8/1986 | Mitchell, Jr. ........................ | 165/80.3 |
| 4,712,159 | 12/1987 | Clemens ............................ | 165/80.3 X |
| 5,313,099 | 5/1994 | Tata et al. ........................... | 257/718 X |
| 5,375,652 | 12/1994 | Matsunaga et al. ................. | 165/80.3 |
| 5,421,402 | 6/1995 | Lin .................................... | 165/80.3 |
| 5,495,392 | 2/1996 | Shen .................................. | 361/697 |
| 5,522,700 | 6/1996 | Hong ................................. | 165/80.3 X |
| 5,541,811 | 7/1996 | Henningsson et al. ............. | 361/704 |

*Primary Examiner*—Leonard R. Leo
*Attorney, Agent, or Firm*—Watson Cole Stevens Davis, P.L.L.C.

[57] ABSTRACT

A heat sink assembly for an integrated circuit comprises a base plate defining a central opening and an integrated circuit receiving slot, a fin plate defining a downwardly extending protrusion, a fan fixedly mounted on a top of the fin, and screws for connecting the fin plate and the base plate together whereby the downwardly extending protrusion of the fin plate is extended through the opening of the base plate.

6 Claims, 3 Drawing Sheets

5,603,374

HEAT SINK ASSEMBLY FOR AN INTEGRATED CIRCUIT

FIELD OF THE INVENTION

The present invention is related to a heat sink assembly for an integrated circuit.

BACKGROUND OF THE INVENTION

Integrated circuits are widely used in computers and electronic devices. During operation, the integrated circuits, particularly those of the Large-Scale Integration (LSI) type, for example, a Central Processing Unit (CPU) will generate heat which needs to be dissipated; otherwise, the temperature of the integrated circuits will rise, which in turn will affect the life and reliability of the integrated circuits.

Although there already have been numbers of integrated circuit heat dissipating devices available in the market, none of these devices can have both a simple structure and effectively dissipate the heat generated by the integrated circuits during operation thereof.

The present invention therefore is aimed to provide an improved heat sink assembly for an integrated circuit to mitigate and/or obviate the aforementioned problems.

SUMMARY OF THE INVENTION

One object of the present invention is to provide a heat sink assembly for an integrated circuit wherein the heat sink assembly has a very simple structure and can be very easy to be assembled with an integrated circuit Another object of the present invention is to provide a heat sink assembly for an integrated circuit wherein the heat sink assembly can very effectively dissipate the heat generated by the integrated circuit during operation thereof.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
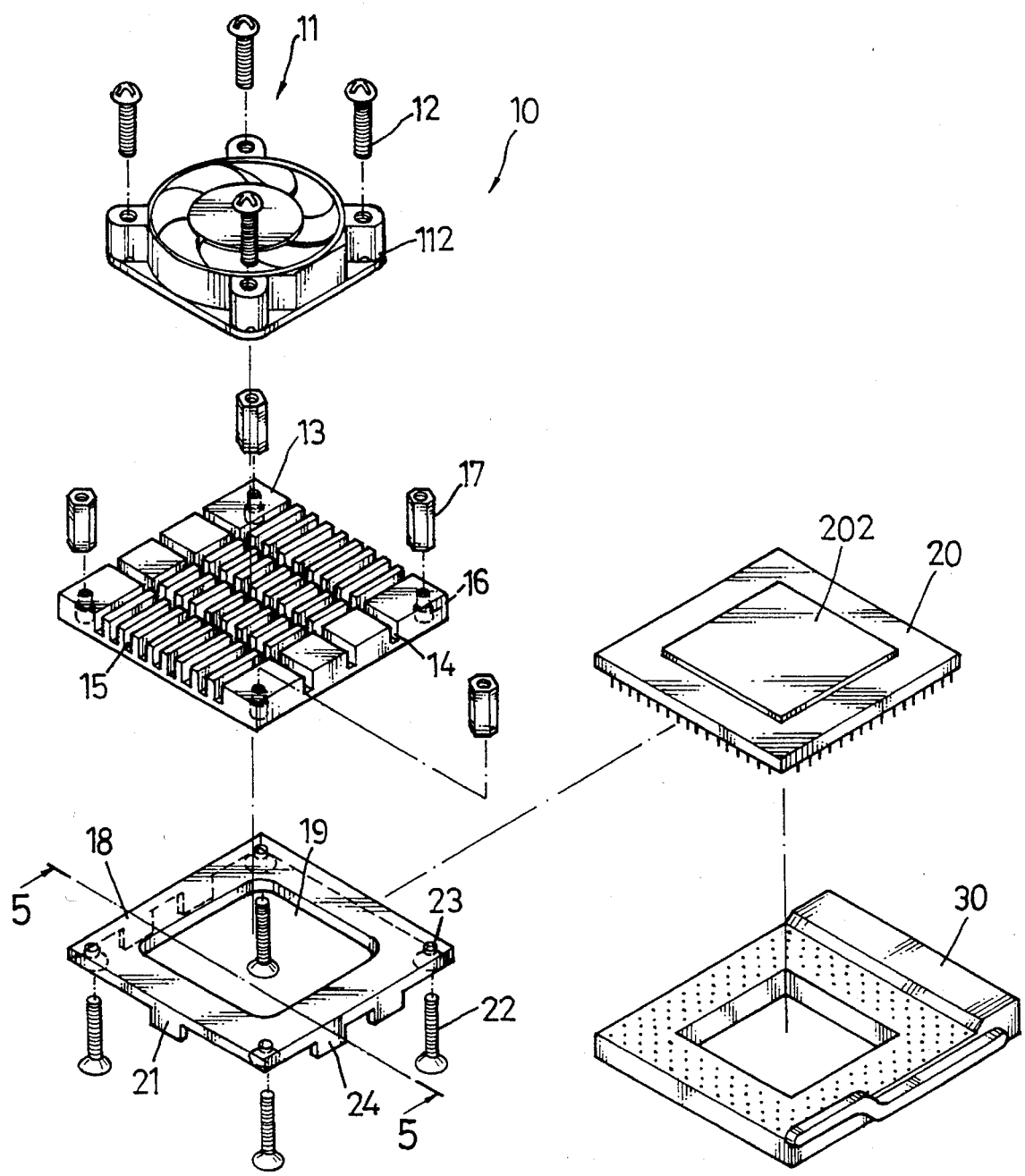
FIG. 1 is a perspective, exploded view, showing a heat sink assembly for an integrated circuit in accordance with the present invention and an integrated circuit and a socket for accommodating the integrated circuit.

Referring to FIG. 1, a heat sink assembly in accordance with the present invention is indicated generally by reference number 10. An integrated circuit which is intended to be assembled with the present heat sink assembly 10 is indicated by reference number 20. A socket for the integrated circuit 20 to be mounted thereon is indicated by reference number 30.

The heat sink assembly 10 consists generally of a fan 11, a fin plate 13 with a substantially square configuration and a base plate 18 also with a substantially square configuration.

A grid of grooves 14 and 15 is defined in a top of the fin plate 13 to increase heat dissipating effectiveness of the fin plate 13. A substantially square protrusion 132 (better seen in FIG. 4) is integrally extended downwardly from a center portion of the fin plate 13. Four stepped-bores 16 are respectively defined in four corners of the fin plate 13.

The fan 11 is mounted on the top of the fin plate 13 by extending four screws 12 respectively through four ears 112 formed on a periphery of the fan 11 to engage the fan 11 to the fin plate 13 defining the grooves 14 and 15.

The base plate 18 defines a substantially square opening 19 in a center thereof. The opening 19 has a size slightly large than the size of the protrusion 132 of the fin plate 13. A pair of two fastening members 24 are integrally formed on two opposite sides of the base plate 18 and extend therefrom downwardly. A single fastening member 21 is integrally formed on a third side of the base plate 18 and also extends therefrom downwardly. The single fastening member 21 is located at a center of the third side. All of the fastening members 24 and 21 have the same configuration, which can be better seen in FIG. 5. Four countersunk bores are respectively defined in four corners of the base plate 18.

Figure 5:
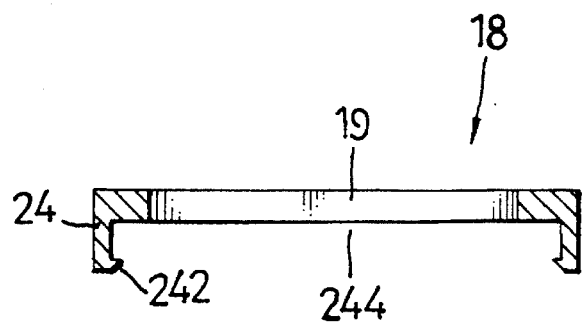
FIG. 5 is a cross-sectional view taken along line 4—4 of FIG. 1.

Referring to FIG. 5, each of the fastening members 24 has a bottom end defining an integrated circuit engaging portion 242 laterally extending toward the opening 19 of the base plate 18. The fastening members 24 and 21 and a top portion of the base plate 18 cooperatively define a slot 244 for accommodating the integrated circuit 20.

Figure 2:
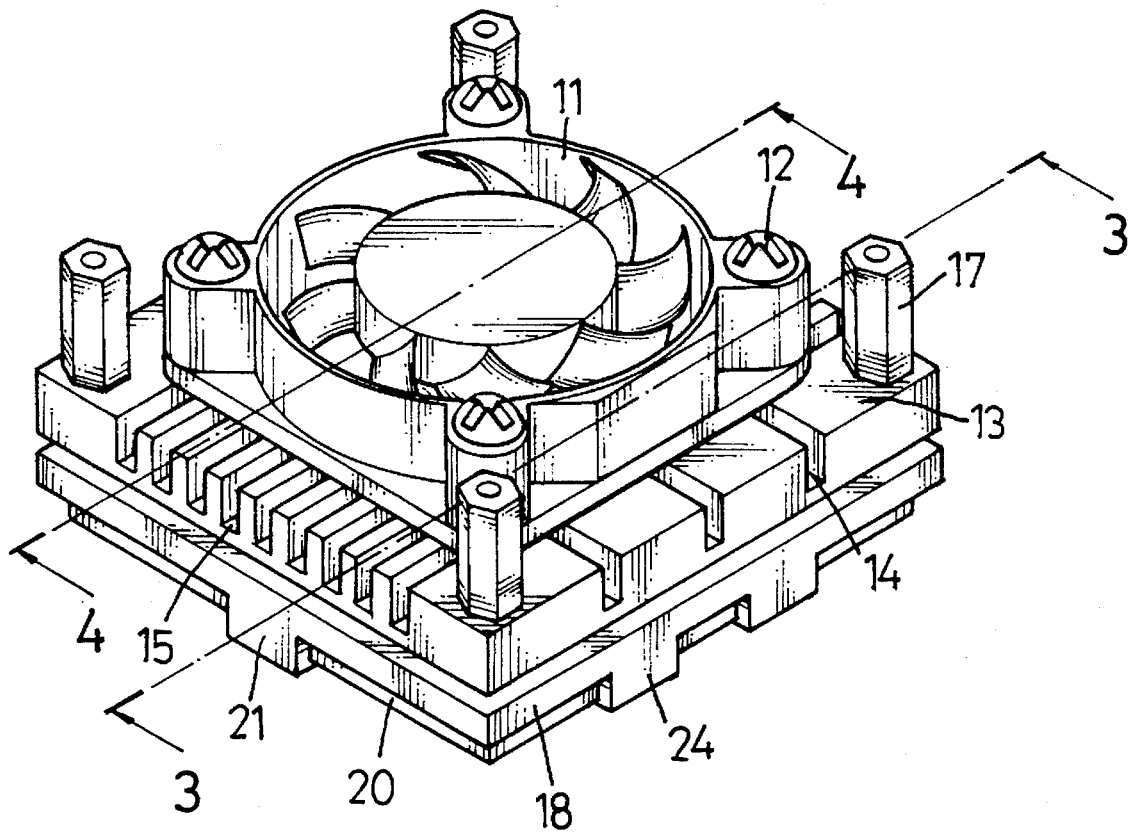
FIG. 2 is a perspective view showing the heat sink assembly of the present invention and the integrated circuit in an assembled state.
Figure 3:
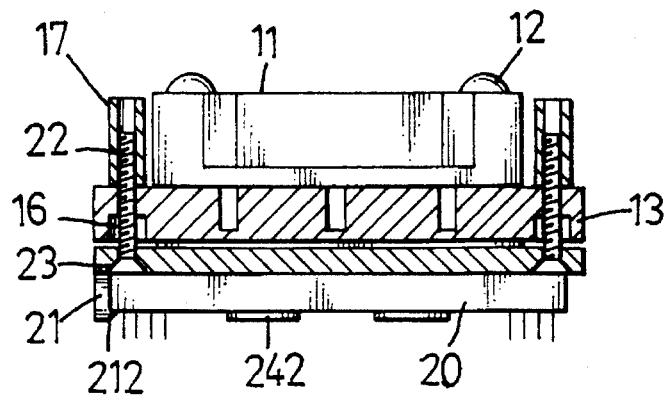
FIG. 3 is a cross-sectional view taken from line 3—3 of FIG. 2.
Figure 4:
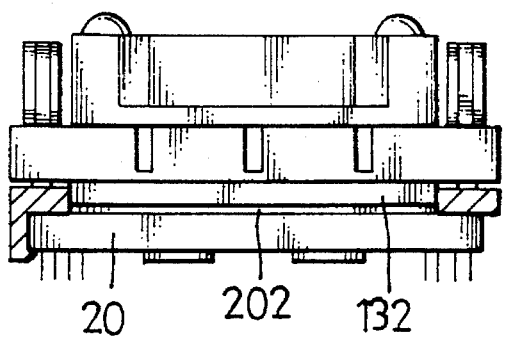
FIG. 4 is a cross-sectional view taken from line 4—4 of FIG. 2.

Now also referring to FIGS. 2, 3 and 4, when the integrated circuit 20 is intended to be assembled with the present heat sink assembly 10, firstly, four screws 22 are brought to respectively extend through the four countersunk bores 23 defined respectively in four corners of the base plate 18, then the integrated circuit 20 is brought into the slot 244 until a front end of the integrated circuit 20 is contacted with the single fastening member 21 wherein the front end of the integrated circuit 20 is supported by an integrated circuit engaging portion 212 defined by a bottom end of the fastening member 21 and two side edges of the integrated circuit are supported by the engaging portions 242 of the fastening members 24. When the integrated circuit 20 is mounted onto the base plate 18, a heat dissipating portion 202 on a top of the integrated circuit 20 is aligned with the opening 19 of the base plate 18.

Thereafter, the fin plate 13 is assembled onto the base plate 18 by extending the four screws 22 through the respective four stepped-bores 16 respectively defined in the four corners of the fin plate 13, in which the downwardly extending portion 132 is extended through the opening 19 of the base plate 18 to contact with the heat dissipating portion 202 of the integrated circuit 20.

Thereafter, four nuts 17 are brought to threadedly engage with the four screws 22 to exert a pushing force on the fin plate 13 thereby to tightly connect the fin plate 13 and the base plate 18 together; thus, the downwardly extending protrusion 132 of the fin plate 13 is intimately contacted with the heat dissipating portion 22 of the integrate circuit 20 thereby the heat generated when the integrated circuit 20 is operated can be effectively dissipated via the fin plate 13 to a surrounding atmosphere.

After the integrated circuit 20 and the present heat sink assembly 10 are assembled together, the combination can be mounted on the socket 30 which may already be soldered to an integrated circuit board.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

I claim:

1. A heat sink assembly for an integrated circuit, comprising:

a substantially square base plate defining an opening and formed with a plurality of downwardly extending integrated circuit fastening members on three sides thereof, said integrated circuit fastening members and a top portion of the base plate cooperatively defining an integrated circuit receiving slot;

a fin plate formed with a downwardly extending protrusion, said downwardly extending protrusion extending through the opening of the base plate and having a substantially square configuration and a size slightly smaller than the opening of the base plate; and means for threadedly connecting the fin plate and the base plate together.

2. The heat assembly in accordance with claim 1, wherein the threadedly connecting means comprises at least one screw extending through the base plate and the fin plate to threadedly engage with a nut.

3. The heat assembly in accordance with claim 1, wherein each of two opposite sides of the three sides is equipped with two integrated circuit fastening members and the side other than the two opposite sides is equipped with only one integrated circuit fastening member positioned at a center thereof.

4. The heat assembly in accordance with claim 1 wherein each of the integrated circuit fastening members is configured to have a bottom end having an integrated circuit engaging portion laterally extending toward a center of the base plate.

5. The heat assembly in accordance with claim 1 further comprising a fan mounted on a top of the fin plate.

6. The heat assembly in accordance with claim 1, wherein the fin plate defines a grid of grooves on a top thereof.

* * * * *